(12) United States Patent
Takayama et al.

(10) Patent No.: US 10,311,903 B2
(45) Date of Patent: Jun. 4, 2019

(54) METHOD AND SYSTEM OF TESTING SLIDER BODY OF THERMALLY-ASSISTED MAGNETIC HEAD

(71) Applicant: SAE Magnetics (H.K.) Ltd., Hong Kong (CN)

(72) Inventors: Seiichi Takayama, Hong Kong (CN); Takashi Honda, Hong Kong (CN); Ryuji Fujii, Hong Kong (CN); Ryo Hosoi, Hong Kong (CN); Kaichiu Cheung, Hong Kong (CN); Tsutomu Sasaki, Hong Kong (CN); Jingtao Lu, GuangDong (CN); Fanglong Nie, GuangDong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 60 days.

(21) Appl. No.: 15/649,961

(22) Filed: Jul. 14, 2017

(65) Prior Publication Data
US 2019/0005980 A1    Jan. 3, 2019

(30) Foreign Application Priority Data

Jun. 28, 2017 (CN) .......................... 2017 1 0504884

(51) Int. Cl.
*G11B 5/455* (2006.01)
*G01R 33/12* (2006.01)
*G11B 5/00* (2006.01)

(52) U.S. Cl.
CPC .......... *G11B 5/455* (2013.01); *G01R 33/1207* (2013.01); *G11B 2005/0021* (2013.01)

(58) Field of Classification Search
CPC .................................................. G01R 33/1207
See application file for complete search history.

(56) References Cited

U.S. PATENT DOCUMENTS

2012/0073120 A1* 3/2012 Shimazawa ............ G11B 5/105
29/603.07

* cited by examiner

*Primary Examiner* — Clayton E. LaBalle
*Assistant Examiner* — Jas A Sanghera
(74) *Attorney, Agent, or Firm* — Nixon & Vanderhye PC

(57) ABSTRACT

A method of testing dynamic performances for a slider body of a thermally-assisted magnetic head includes: providing a slider body which is disconnected with a light source unit; removably mounting the slider body to a test head suspension assembly; keeping to provide a flat top beam to the slider body, the flat top beam being aligned with the optical waveguide, and a projection of an incident end of the optical waveguide being located within a light spot of the flat top beam; and testing the dynamic performance of the slider body. It can save the material cost and labor cost, and eliminate a precise optical alignment between an input light and an optical waveguide in the slider body to improve testing efficiency.

14 Claims, 11 Drawing Sheets

METHOD AND SYSTEM OF TESTING SLIDER BODY OF THERMALLY-ASSISTED MAGNETIC HEAD

This application claims priority to CN Patent Application No. 201710504884.8 filed Jun. 28, 2017, the entire contents of which are hereby incorporated by reference.

FIELD OF THE INVENTION

The present invention relates to a hard disk drive (HDD) with thermally-assisted magnetic heads and, more particularly, to a method and a system of testing dynamic performances for a slider body of a thermally-assisted magnetic head.

BACKGROUND OF THE INVENTION

HDDs are common information storage devices. With improvements in recording density of magnetic HDDs, there has been a demand for improving the performance of magnetic heads and magnetic recording media. In a magnetic hard disk drive, a magnetic head is embedded in a slider that flies above the surface of a magnetic recording medium.

Recently, a technology so-called thermal assisted magnetic recording (TAMR) has been proposed, and a thermal assisted magnetic head also has been put to use. The technology uses a magnetic recording medium having high coercivity. When writing data, a write magnetic field and heat are applied almost simultaneously to the area of the magnetic recording medium where to write data, so that the area rises in temperature and drops in coercivity for data writing. The area where data is written subsequently falls in temperature and rises in coercivity to increase the thermal stability of magnetization.

Commonly, the heat source comes from the thermal assisted magnetic head. FIG. 1A shows a perspective view of a conventional thermal assisted magnetic head 100. The thermal assisted magnetic head 100 includes a slider body 110 having an air bearing surface (ABS) (not shown, under) processed so as to provide an appropriate flying height and a light source unit 130 mounted on the slider body 110. The slider body 110 includes a bottom surface 112 opposite the ABS, a trailing edge 113 where read and write elements 115 are embedded, and a leading edge (not shown, back) opposite the trailing edge 113. The light source unit 130 is mounted on the bottom surface 112 and on the position where the write elements are embedded via a bonding layer. The light source unit 130 includes a laser diode 131 located near the write element and a mounting base 132 for supporting the laser diode 131. The mounting base 132 is bonded to the slider body 110 by using a solder layer, for example. The laser diode 131 emits a laser light to a portion of the magnetic recording medium, which reduces the medium's coercivity. After that, writing is performed by applying write magnetic field to the heated portion; therefore the writing operation is facilitated.

For ensuring the performances of the TAMR head, a serial testing for the TAMR heads must been carried out, including dynamic testing and static test. A conventional dynamic performance testing is performed at TAMR-level, namely the light source unit 130 has been bonded to the slider body 110 to form a TAMR head 100. In detail, firstly, the TAMR head 100 is mounted to a dynamic tester, and then, the laser diode 131 in the light source unit 130 emits a beam to an incident end of an optical waveguide 140 in the TAMR head, as shown in FIG. 1B, and then, the light power of the beam from the light source unit 130 will be detected to find the maximum light power position, and finally an optical alignment between maximum light power position and the incident end of the optical waveguide is made to start the dynamic performance testing.

Since the beam emitted by the laser diode is a Gaussian beam, the amplitude distribution of its cross section follows the Gaussian function, as shown in FIG. 1C, the amplitude of both sides is symmetrically reduced with the maximum amplitude intensity. Therefore, the optical waveguide must be precisely aligned to find the position of the maximum amplitude of the beam, that is, the maximum light power position. The dynamic performance testing is carried out after the accurate alignment, so as to find a defective head which will be discarded. This dynamic testing method at the TAMR level requires precise alignment of the beam, thus the testing efficiency is low, further the defective head screened out will be discarded, which makes the bonding process between the light source unit and the slider body meaningless, thereby wasting resources and increasing manufacturing cost.

Thus, it is desired to provide an improved method and system of testing dynamic performances for a slider body of a thermally-assisted magnetic head, before a light source unit is attached thereon, so as to screen out a defective slider to save the material cost and labor cost in the subsequent process.

SUMMARY OF THE INVENTION

One objective of the present invention is to provide a method of testing dynamic performances for a slider body of a thermally-assisted magnetic head, which is carried out in slider level without attaching a light source unit thereon to save the material cost and labor cost in subsequent process, and eliminates a precise optical alignment between an input light and an optical waveguide in the slider body to improve testing efficiency.

Another objective of the present invention is to provide a system of testing dynamic performances for a slider body of a thermally-assisted magnetic head, the test is carried out in slider level without attaching a light source unit thereon to save the material cost and labor cost in subsequent process, and a precise optical alignment between an input light and an optical waveguide in the slider body is unnecessary to improve testing efficiency.

To achieve above objectives, a method of testing dynamic performances for a slider body of a thermally-assisted magnetic head includes:

providing a slider body which is disconnected with a light source unit, the slider body including a thermally-assisted magnetic head section, an air bearing surface and an optical waveguide;

removably mounting the slider body to a test head suspension assembly which is loaded to a dynamic testing device;

keeping to provide a flat top beam to the slider body along a direction vertical to an opposite surface of the air bearing surface, the flat top beam being aligned with the optical waveguide, and a projection of an incident end of the optical waveguide being located within a light spot of the flat top beam; and testing the dynamic performance of the slider body.

As a preferred embodiment, the projection of the incident end of the optical waveguide is located in a center of the light spot of the flat top beam.

Preferably, the light spot of the flat top beam is in circle shape or oval shape.

Preferably, the light spot of the flat top beam is in circle shape whose diameter is less than 10 μm.

Preferably, an incident light power on the incident end of the optical waveguide is in a range of 30 mW~1000 mW.

Accordingly, system of testing dynamic performances for a slider body of a thermally-assisted magnetic head includes:

a dynamic performance testing device, comprising a test head suspension assembly for supporting a slider body which is disconnected with a light source unit, the slider body including a thermally-assisted magnetic head section, an air bearing surface and an optical waveguide; and a light source supplying device, adapted for providing a flat top beam to the slider body along a direction vertical to an opposite surface of the air bearing surface, the flat top beam being aligned with the optical waveguide, and a projection of an incident end of the optical waveguide being located within a light spot of the flat top beam.

As a preferred embodiment, the projection of the incident end of the optical waveguide is located in a center of the light spot of the flat top beam.

Preferably, the light spot of the flat top beam is in circle shape or oval shape.

Preferably, the light spot of the flat top beam is in circle shape whose diameter is less than 10 μm.

Preferably, an incident light power on the incident end of the optical waveguide is in a range of 30 mW-1000 mW.

Preferably, the light source supplying device comprises a laser device and a flat top beam shaper.

A method of testing dynamic performances for a slider body of a thermally-assisted magnetic head includes:

providing a slider body which is disconnected with a light source unit, the slider body including a thermally-assisted magnetic head section, an air bearing surface and an optical waveguide;

removably mounting the slider body to a test head suspension assembly which is loaded to a dynamic testing device, the test head suspension assembly being firmly connected with a test light source unit, and the test light source unit being configured to face to an opposite surface of the air bearing surface;

controlling the test light source unit to provide a Gaussian beam to the slider body, with the Gaussian beam aligning with the optical waveguide; and testing the dynamic performance of the slider body.

A method of testing dynamic performances for a slider body of a thermally-assisted magnetic head includes:

providing a slider body which is disconnected with a light source unit, the slider body including a thermally-assisted magnetic head section, an air bearing surface and an optical waveguide;

removably mounting the slider body to a test head suspension assembly which is loaded to a dynamic testing device;

keeping to provide a Gaussian beam to the slider body along a direction vertical to an opposite surface of the air bearing surface, with the Gaussian beam aligning with the optical waveguide;

controlling the Gaussian beam to move synchronously with track motions of the slider body; and testing the dynamic performance of the slider body.

A method of testing dynamic performances for a slider body of a thermally-assisted magnetic head includes:

providing a slider body and a light source unit, the light source unit being temporarily attached on an opposite surface of an air bearing surface of the slider body;

aligning a Gaussian beam emitting from the light source unit with an optical waveguide of the slider body; and testing the dynamic performance of the slider body and permanently bonding the light source unit on the slider body if the slider body is qualified.

In comparison with the prior art, as the dynamic performance testing method of the present invention is carried out at slider level with a light source unit is connected thereon, therefore, if the slider body is qualified after the testing, a light source unit will be bonded thereon by YAG laser or UV epoxy bonding; if the slider body is defective after the testing, it will be discarded, thus the material cost and labor cost are reduced by comparison of the conventional TAMR-level testing. Furthermore, a flat top beam is introduced instead of a Gaussian beam, as the light power of the flat top beam located in the light spot area is even and the same, thus there is no need to do a precise optical alignment between the flat top beam and the incident end of the optical waveguide to find the maximum light power position before the dynamic performance testing is started, instead, it's enough to do a rough and simple optical alignment to make sure that the projection of the incident end of the optical waveguide is located within the light spot of the flat top beam.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
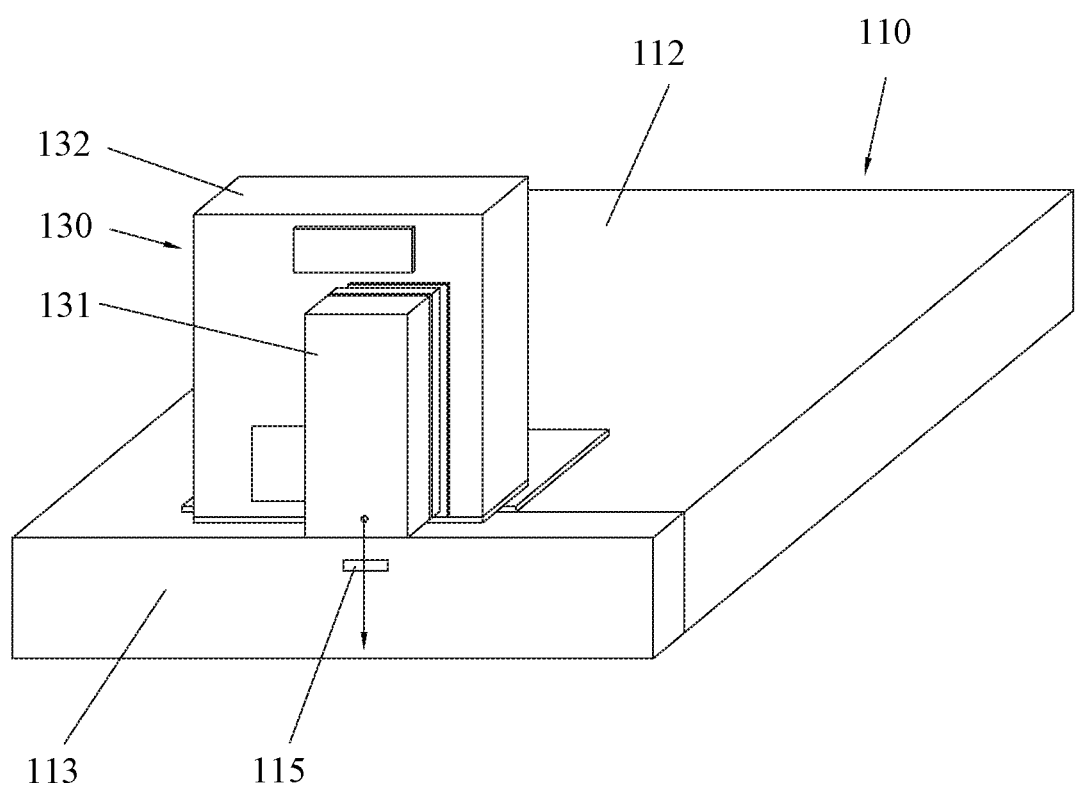
FIG. 1A is a perspective view of a conventional thermally-assisted magnetic head.
Figure 1B:
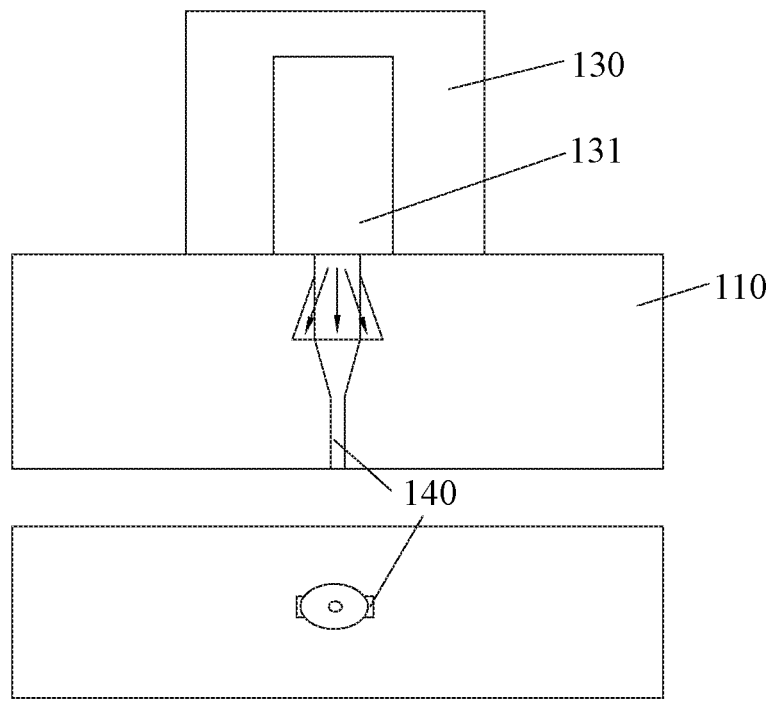
FIG. 1B is a simplified schematic view showing the conventional testing process.
Figure 1C:
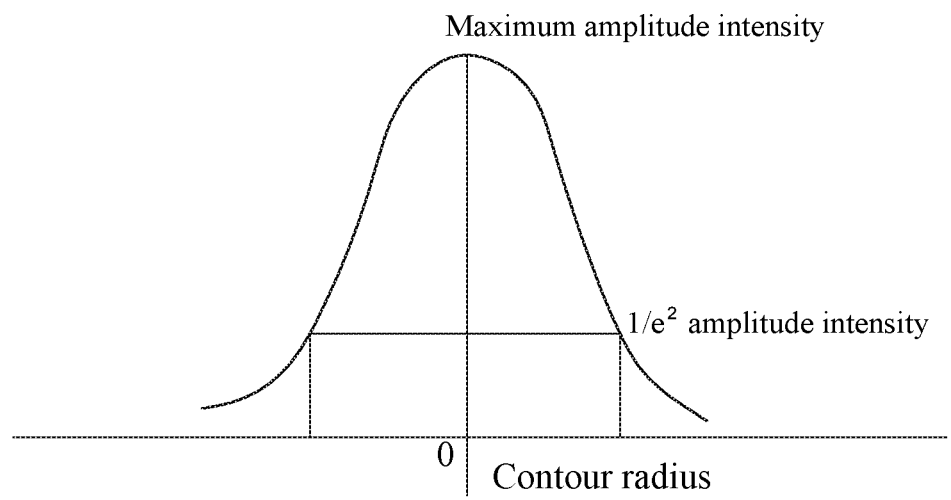
FIG. 1C shows the amplitude distribution of Gaussian beam emitted from a laser diode.

Various preferred embodiments of the invention will now be described with reference to the figures, wherein like reference numerals designate similar parts throughout the various views. As indicated above, the invention is directed to methods and systems of testing dynamic performances for a slider body of a thermally-assisted magnetic head, the testing is carried out in slider level without attaching a light source unit thereon, thus the material cost and labor cost in subsequent process are saved, furthermore a precise optical alignment between an input light and an optical waveguide in the slider body is unnecessary to improve testing efficiency. By dynamically testing the slider body before the light source unit is bonded thereon, a defective slider body can be individually scrapped rather than the entire thermally-assisted magnetic head.

Figure 2:
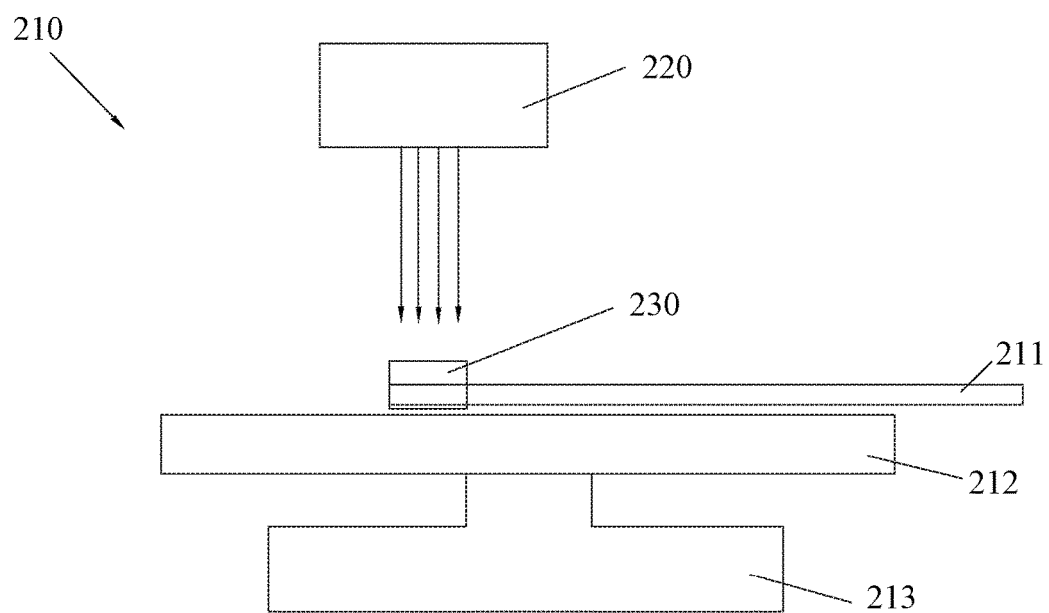
FIG. 2 is a simplified schematic view showing a testing device accordingly to the present invention.

In the present invention, a sample slider body is mounted to a test head suspension assembly to undergo the dynamic performance testing. FIG. 2 illustrates a partial dynamic performance testing device 210 including a test head suspension assembly 211, a test disk 212 and a spindle motor 213 connected to the test disk 212, and a sample slider body 230 is supported by the test head suspension 211 to form a test disk drive unit which is connected to a computing device (not shown) so as to carry out the dynamic performance testing. As an aspect of the instant invention, a light source supplying device 220 is configured to provide light beams to the slider body and the disk so as to test the performances such as the writing performance.

Figure 3:
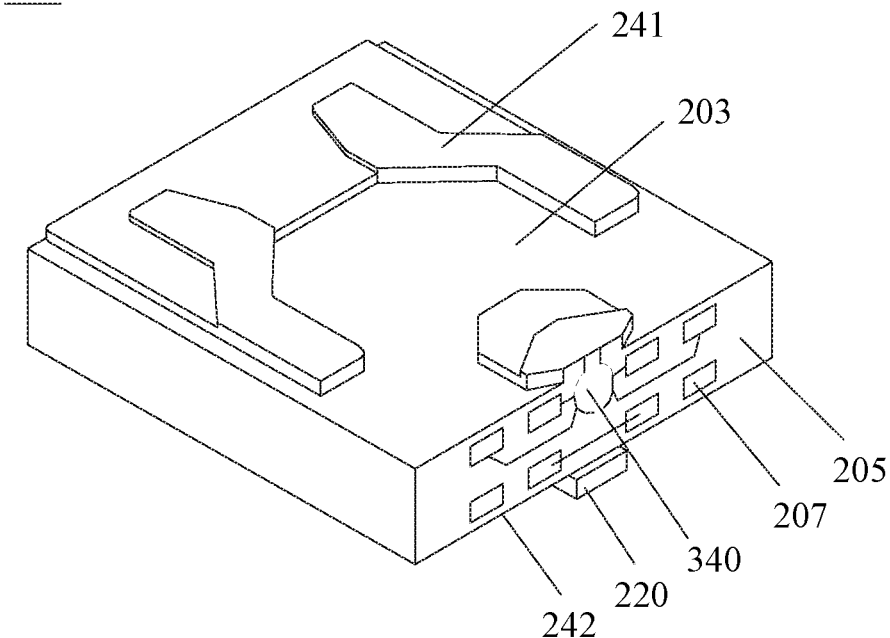
FIG. 3 is a perspective view of a thermally-assisted magnetic head slider with a thermally-assisted magnetic head section according to an embodiment of the present invention.

As shown in FIG. 3, the sample slider body 230 of a thermally-assisted magnetic head before a light source unit is connected thereon includes a substrate 203, and a thermally-assisted magnetic read write head 340 embedded in the substrate 203 for reading and writing. The substrate 203 may be substantially formed as a hexahedron, for example, and one surface thereof corresponds to an ABS 241 that is disposed in proximity to and to face the recording surface of the magnetic disk 212. When the disk 212 is rotated at a high speed, the slider 230 will move above the front surface of the magnetic disk 212 to be in a load state. The high-speed rotation of the magnetic disk 212 causes an air flow between the recording surface and the ABS 241, and the resulting lift force leads to a state where the slider 230 floats to maintain a certain distance (magnetic spacing) in a direction orthogonal to the recording surface.

Specifically, referring to FIG. 3 again, the substrate 203 includes a leading edge (not shown), a trailing edge 205, an ABS 241 facing to the disk and processed so as to provide an appropriate flying height, an opposite surface 242 opposite to the ABS 241, and a thermally-assisted magnetic read write head 340 embedded in the trailing edge 205. The trailing edge 205 has multiple bonding pads 207, such as eight, to couple with the test head suspension assembly 211.

More specifically, the thermally-assisted magnetic head 340 includes a magnetoresistive (MR) read head section (not shown) formed on the substrate 203 and a write head section 342 formed on the MR read head. For example, the MR read head can be Current Perpendicular to Plane (CPP) sensor, Current In Plane (CIP) sensor, tunnel magnetoresistive (TMR) sensor, giant magnetoresistive (GMR) sensor, or anisotropic magnetoresistive (AMR) sensor and the like.

Figure 4:
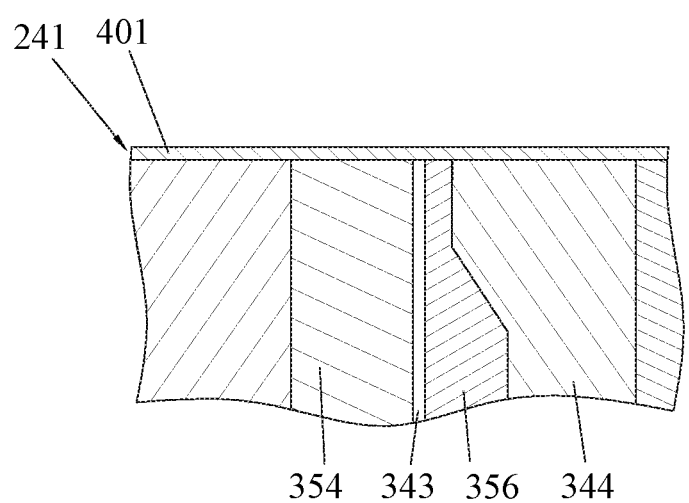
FIG. 4 is a cross-section view of the thermally-assisted magnetic write head section of FIG. 3.

FIG. 4 is an enlarged sectional view of the thermally-assisted magnetic write head section 342 of the thermally-assisted magnetic read write head 340 according to an embodiment. Specifically, the thermally-assisted magnetic write head section 342 includes a magnetic pole 344 in which several coils (not shown) are sandwiched, an optical waveguide 354 formed adjacent to the magnetic pole 344 for guiding light generated by the light source unit 220, and a plasmon generator 356 sandwiched between the magnetic pole 344 and the optical waveguide 354 for propagating near-field light to the ABS 241. And a gap 343 is formed between the optical waveguide 354 and the plasmon generator 356. The optical waveguide 354 is formed by a dielectric material that allows laser light to pass therethrough. And a cover layer 401 is covered to form the ABS 241.

Figure 6:
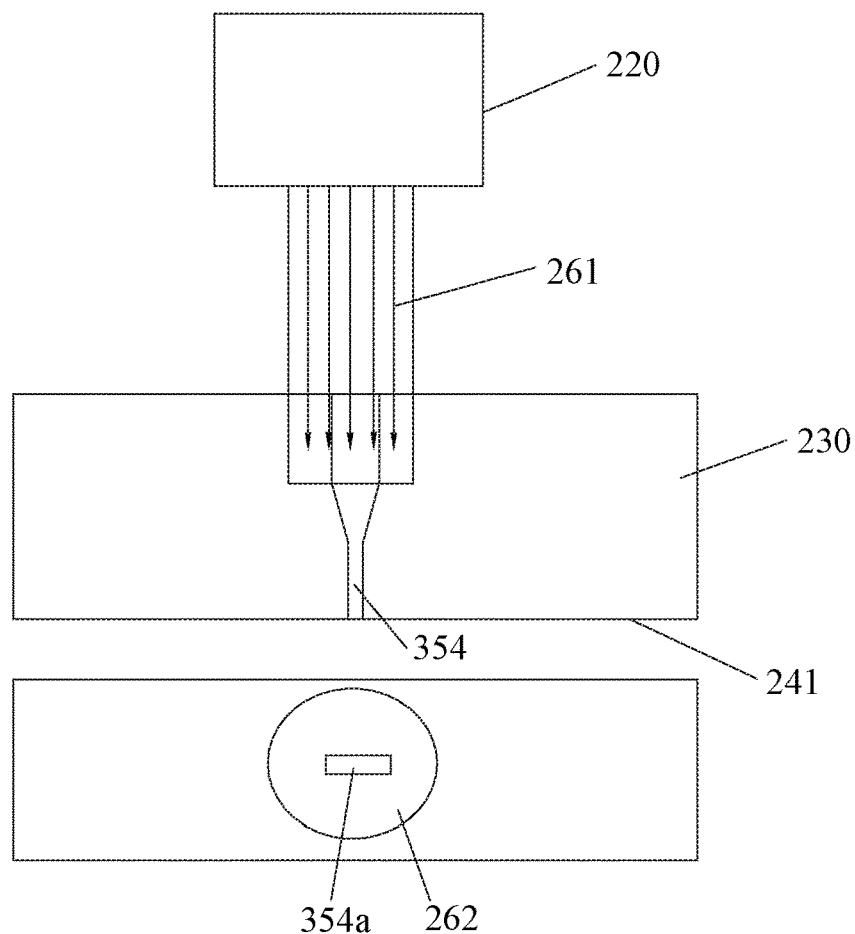
FIG. 6 is a simplified schematic view showing the testing process by using a flat top beam with circular light spot on the ABS image, according to one embodiment.

As an embodiment, as shown in FIG. 6, the light source supplying device 220 includes a laser device (not shown) and a flat top beam shaper (not shown), which is adapted for providing a flat top beam 261 to the slider body 230 along a direction vertical to the opposite surface 242 of the ABS 241, the flat top beam 261 is aligned with the optical waveguide 354, and a projection of an incident end 354a of the optical waveguide 354 along the direction is located within a light spot 262 of the flat top beam 261.

Figure 5:
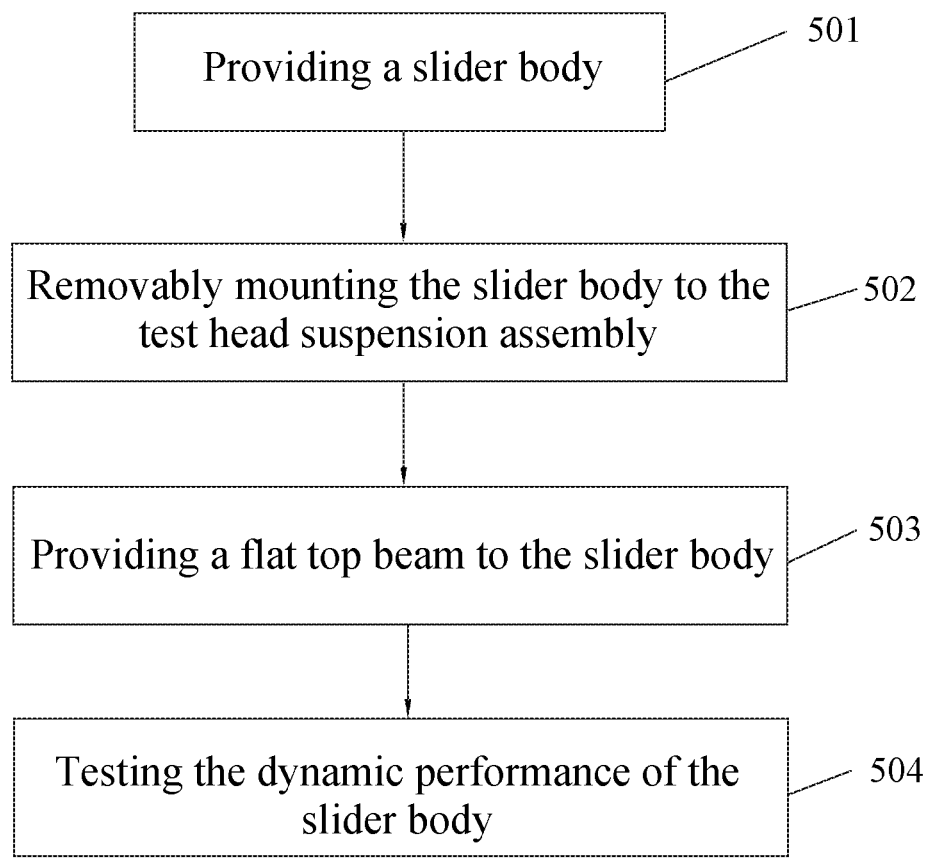
FIG. 5 is a simplified flowchart of a method of testing dynamic performances for a slider body of a thermally-assisted magnetic head according to a first embodiment of the present invention.

FIG. 5 shows a simplified flowchart of a method of testing dynamic performances for a slider body of a thermally-assisted magnetic head, the method includes the following steps:

S501, providing a slider body 230 which is disconnected with a light source unit;

S502, removably mounting the slider body 230 to the test head suspension assembly 211;

S503, providing a flat top beam 261 to the slider body 230 along a direction vertical to the opposite surface 242 of the ABS 241; and S504, testing the dynamic performance of the slider body 230.

Specifically, in the step S503, the flat top beam 261 is aligned with the optical waveguide 354, and a projection of the incident end of the optical waveguide 354 is located within the light spot 262 of the flat top beam 261. Preferably, the flat top beam 261 is emitted from a laser device (not shown) and transmitted through a flat top beam shaper (not shown), such as an aspheric beam shaper.

As a preferable embodiment, the flat top beam 261 is positioned to align with the optical waveguide 354 to make the projection of the incident end of the optical waveguide 354 is located in a center of the light spot 262 of the flat top beam 261, as shown in FIG. 6. Specifically, the shape of the light spot of the flat top beam can be circular or oval, and the shape of the projection of the incident end of the optical waveguide is rectangular.

In this embodiment, an incident light power on the incident end of the optical waveguide is in a range of 30 mW~1000 mW, which is dependent on the detailed design of the thermally-assisted magnetic heads. As well known by persons skilled in the art, a light power density at the incident end of the optical waveguide should be maintained in a certain valve, thus the area of the light spot of the flat top beam and the light power should be controlled. For example, in this embodiment, the light power density at the incident end of optical waveguide is 10 mW/µm², the light spot of the flat top beam is circular and has a diameter of 10 µm, and thus the required light power is 1000 mW. Although the size of the light spot of the flat top beam can be changed, a suitable light power of the flat top beam is desirable to make the testing feasible. Preferably, the light spot of the flat top beam is in circle shape whose diameter is less than 10 µm.

Figure 7A:
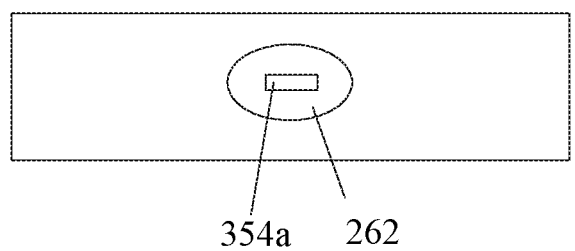
FIGS. 7A-7B showing an ABS image of the slider body showing oval light spot of the flat top beam.
Figure 7B:
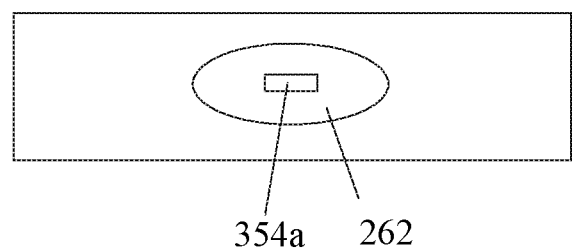

Alternatively, the shape of the light spot 262 of the flat top beam 261 can be controlled as oval, as illustrated in FIGS. 7A and 7B, which is dependent on the shape of the optical waveguide 354.

Figure 8:
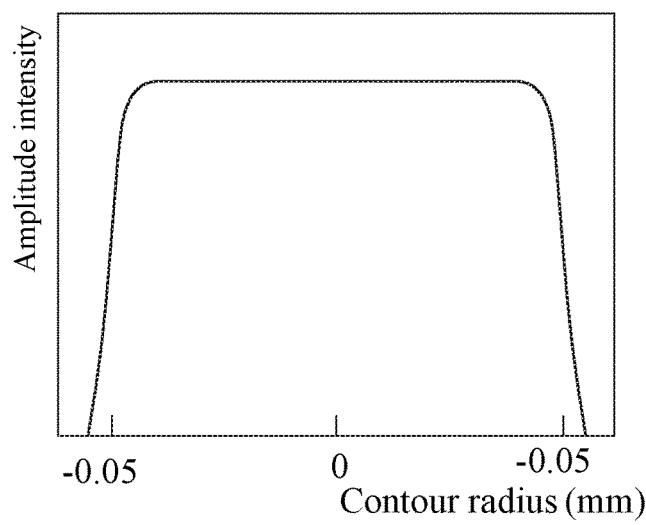
FIG. 8 shows a light power amplitude distribution of a flat top beam.

FIG. 8 shows a light power amplitude distribution of a flat top beam, it can be seen that, the amplitudes in the effective range are the same, in other words, the light power of the flat top beam located in the light spot area is even and the same. Therefore, based on the introduction of the flat top beam instead of a Gaussian beam, there is no need to do a precise optical alignment between the flat top beam and the incident end of the optical waveguide to find the maximum light power position before the dynamic performance testing is started, instead, it's enough to do a rough and simple optical alignment to make sure that the projection of the incident end of the optical waveguide is located within the light spot of the flat top beam. Furthermore, since the dynamic performance testing is carried out in slider level without attaching a light source unit thereon, if the slider body is qualified after the testing, a light source unit will be bonded thereon by YAG laser or UV epoxy bonding; if the slider body is defective after the testing, it will be discarded, thus the material cost and labor cost are reduced by comparison of the conventional TAMR-level testing.

Figure 9A:
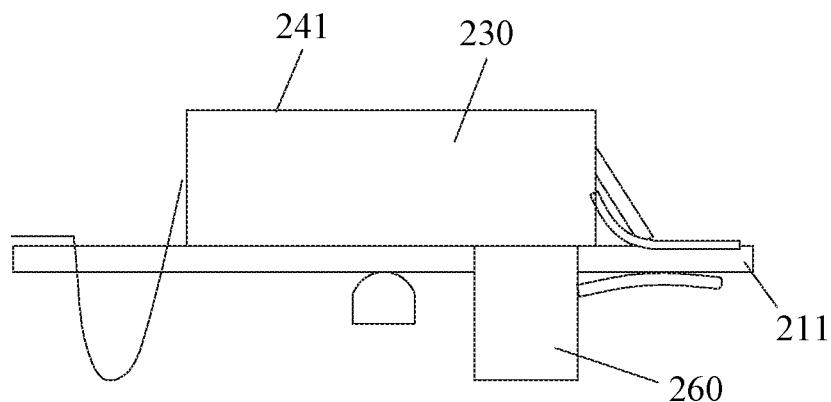
FIG. 9A is a side view showing a slider body is clamped by a test head suspension assembly with a light source unit is bonded thereon.
Figure 9B:
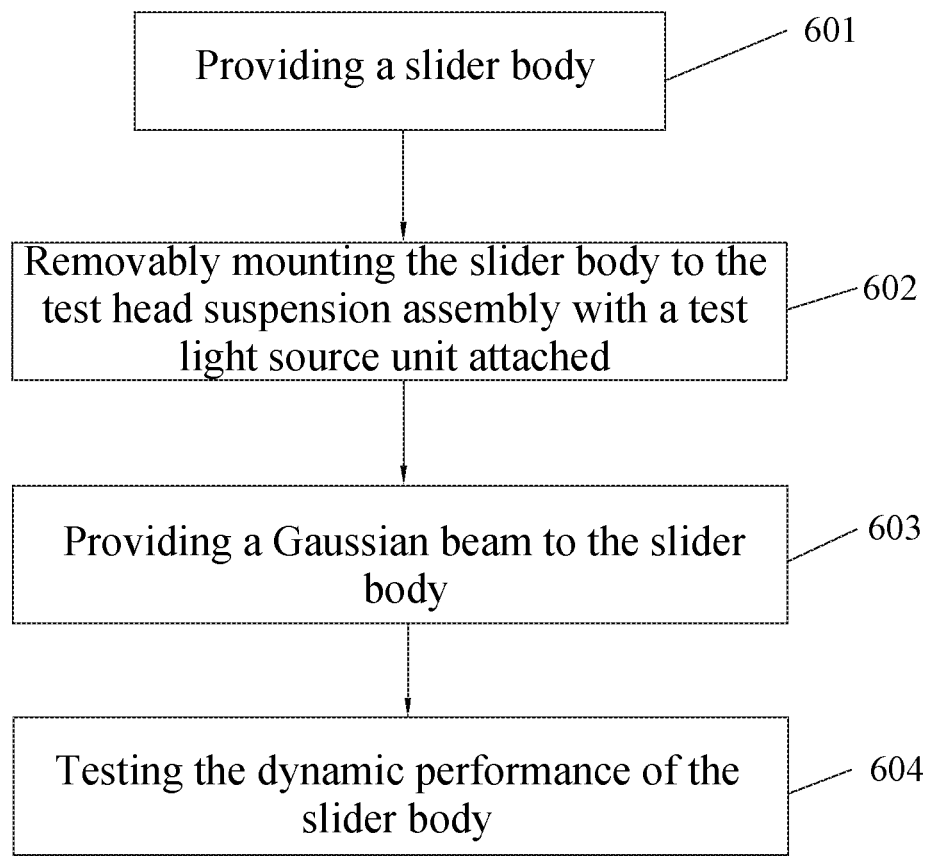
FIG. 9B is a simplified flowchart of a method of testing dynamic performances for a slider body of a thermally-assisted magnetic head according to a second embodiment of the present invention.

As a second embodiment of the present invention, the dynamic performance testing is performed by using a test head suspension assembly and a test light source unit which is firmly connected to the test head suspension assembly, as shown in FIGS. 9A and 9B. In this embodiment, test is carried out at slider level as well.

Specifically, the testing method includes the following steps:

S601, providing a slider body 230 which disconnects with a light source unit;

S602, removably mounting the slider body 230 to a test head suspension assembly 211 which is loaded to a dynamic testing device; specifically, the test head suspension assembly 211 is firmly connected with a test light source unit 260, and the test light source unit 260 is configured to face to an opposite surface 242 of the ABS 241 of the slider body 230;

S603, controlling the test light source unit 260 to provide a Gaussian beam to the slider body 230, with the Gaussian beam aligning with the optical waveguide; and S604, testing the dynamic performance of the slider body 230.

In the step of S602, the test light source unit 260 is accurately bonded to the test head suspension assembly 211 in advance, and the mounting position of the slider body 230 has been set accurately as well, if a slider body 230 is clamped and positioned on the test head suspension assembly 211, a fine alignment between the test light source unit 260 and the slider body 230 is unnecessary. Therefore the test is efficient.

Figure 10A:
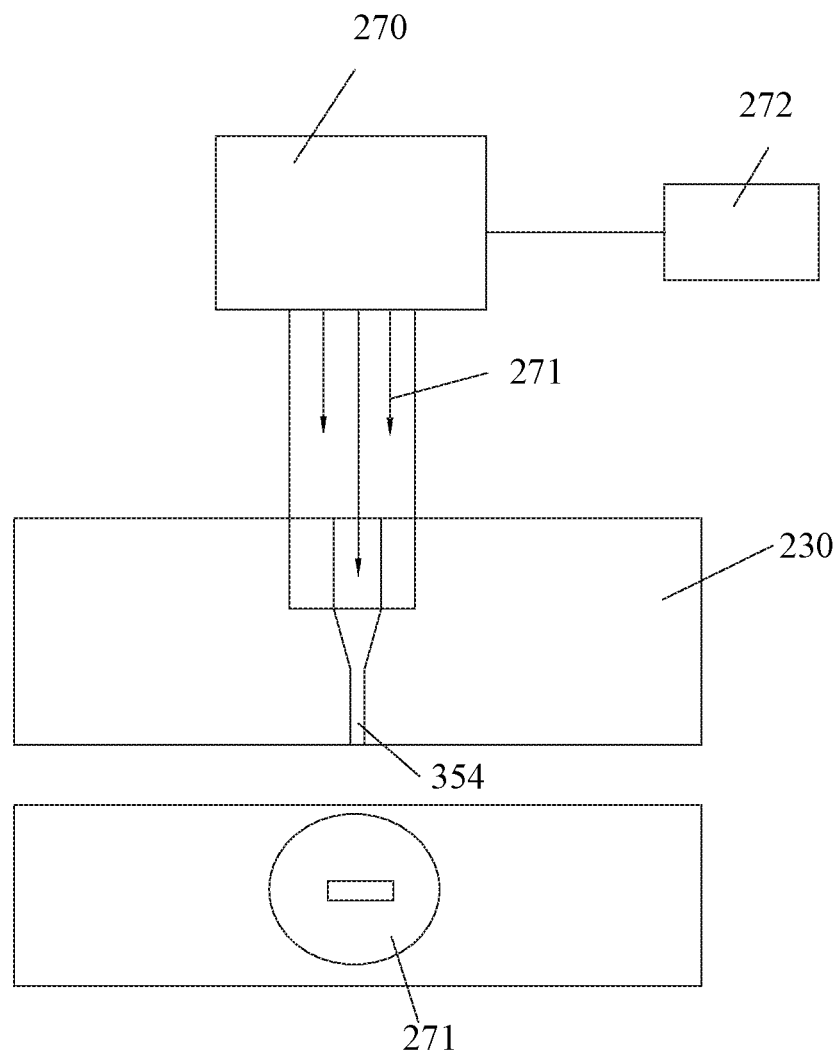
FIG. 10A is a simplified schematic view showing the testing process by using a Gaussian beam according to another embodiment.
Figure 10B:
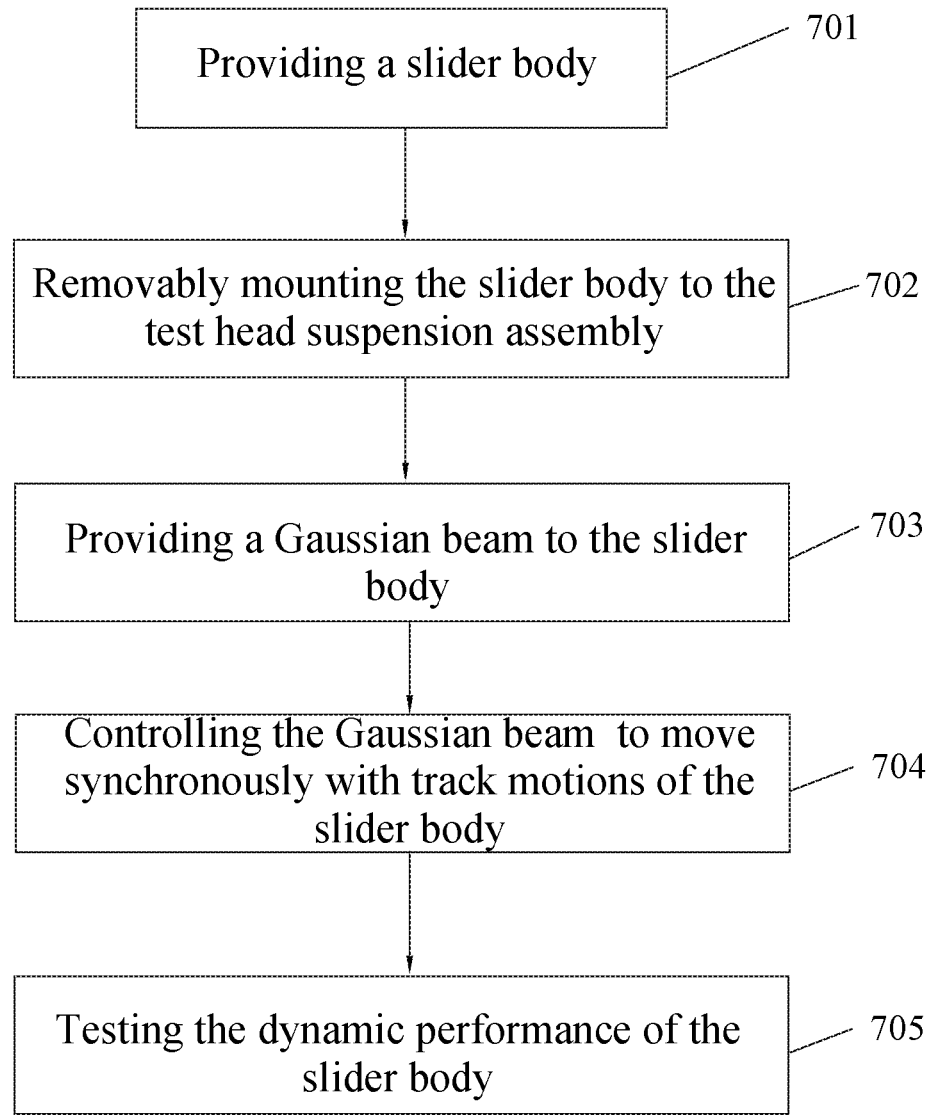
FIG. 10B is a simplified flowchart of a method of testing dynamic performances for a slider body of a thermally-assisted magnetic head according to a third embodiment of the present invention.

As a third embodiment of the present invention, the dynamic performance testing is performed by using a test head suspension assembly, a light source supplying device for emitting Gaussian beams and a movement controller connected with the light source supplying device, as shown in FIGS. 10A and 10B.

Specifically, the testing method includes the following steps:

S701, providing a slider body 230 which is disconnected with a light source unit;

S702, removably mounting the slider body 230 to a test head suspension assembly which is loaded to a dynamic testing device;

S703, keeping to provide a Gaussian beam 271 to the slider body 230 along a direction vertical to an opposite surface of the ABS, with the Gaussian beam 271 aligning with the optical waveguide;

S704, controlling the Gaussian beam 271 to move synchronously with track motions of the slider body 230; and S705, testing the dynamic performance of the slider body 230.

In the step of S703, the Gaussian beam 271 is emitted by a light source supplying device 270, such as a laser device. In the step of S704, a movement controller 272 is connected with the light source supplying device 270 to control the light source supplying device 270 to move, so that the Gaussian beam 271 is kept to move synchronously with track motions of the slider body 230 to make sure the optical alignment between the Gaussian beam 271 and the optical waveguide 354.

Figure 11:
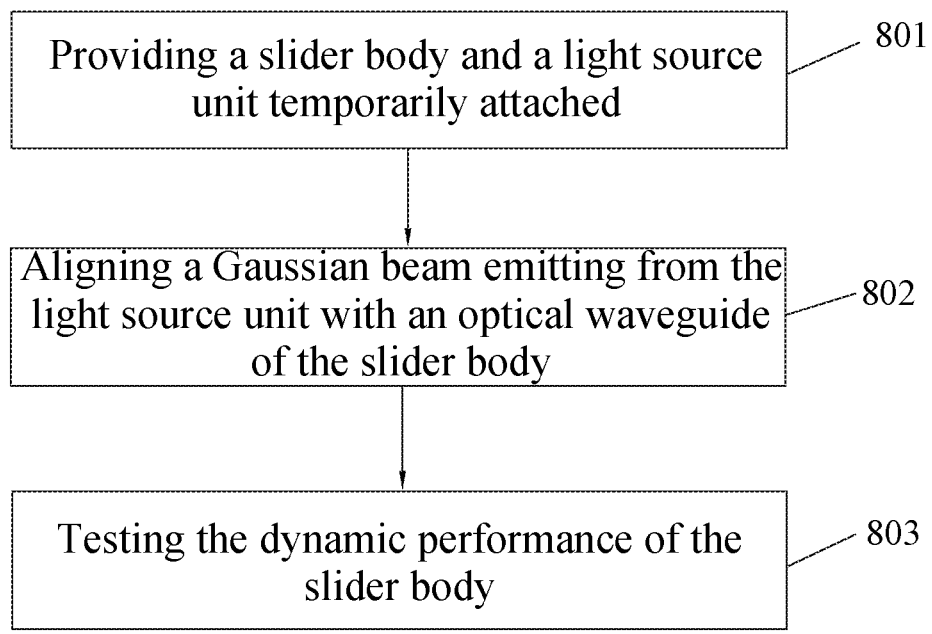
FIG. 11 is a simplified flowchart of a method of testing dynamic performances for a slider body of a thermally-assisted magnetic head according to a fourth embodiment of the present invention.

As a fourth embodiment of the present invention, FIG. 11 shows a testing method which is performed at TAMR level with a light source unit is temporarily bonded. The method includes the following steps:

S801, providing a slider body and a light source unit, with the light source unit being temporarily attached on an opposite surface of an air bearing surface of the slider body;

S802, aligning a Gaussian beam emitting from the light source unit with an optical waveguide of the slider body; and S803, testing the dynamic performance of the slider body.

In the step of S801, the light source unit is temporarily bonded to the slider body via weak UV epoxy. After the dynamic performance testing is done, for a qualified slider body, the light source unit and the slider body will be connected in a permanent manner, for example the light source unit will be bonded to the slider body by YAG laser or UV epoxy permanent bonding, and for a defective slider body, the light source unit will be removed from the slider body and be used for next sample slider body, and the defective slider body will be discarded. In such a way, the material cost and the labor cost are still reduced by comparison with the conventional testing method.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method of testing dynamic performance for a slider body of a thermally-assisted magnetic head, the method comprising:
providing the slider body, the slider body being disconnected with a light source unit and including a thermally-assisted magnetic head section, an air bearing surface and an optical waveguide;
removably mounting the slider body to a test head suspension assembly loaded to a dynamic testing device;

keeping to provide a flat top beam to the slider body along a direction vertical to an opposite surface of the air bearing surface, the flat top beam being aligned with the optical waveguide, and a projection of an incident end of the optical waveguide along said direction being located within a light spot of the flat top beam; and testing the dynamic performance of the slider body.

2. The method according to claim 1, wherein the projection of the incident end of the optical waveguide is located in a center of the light spot of the flat top beam.

3. The method according to claim 1, wherein the light spot of the flat top beam is in circle shape or oval shape.

4. The method according to claim 1, wherein the light spot of the flat top beam is in circle shape having a diameter that is less than 10 μm.

5. The method according to claim 1, wherein an incident light power on the incident end of the optical waveguide is in a range of 30 mW~1000 mW.

6. A system of testing dynamic performance for a slider body of a thermally-assisted magnetic head, the system comprising:
 a dynamic performance testing device, comprising a test head suspension assembly for supporting the slider body, the slider body being disconnected with a light source unit and including a thermally-assisted magnetic head section, an air bearing surface and an optical waveguide; and
 a light source supplying device, adapted for providing a flat top beam to the slider body along a direction vertical to an opposite surface of the air bearing surface, the flat top beam being aligned with the optical waveguide, and a projection of an incident end of the optical waveguide being located within a light spot of the flat top beam.

7. The system according to claim 6, wherein the projection of the incident end of the optical waveguide is located in a center of the light spot of the flat top beam.

8. The system according to claim 6, wherein the light spot of the flat top beam is in circle shape or oval shape.

9. The system according to claim 6, wherein the light spot of the flat top beam is in circle shape having a diameter that is less than 10 μm.

10. The system according to claim 6, wherein an incident light power on the incident end of the optical waveguide is in a range of 30 mW~1000 mW.

11. The system according to claim 6, wherein the light source supplying device comprises a laser device and a flat top beam shaper.

12. A method of testing dynamic performance for a slider body of a thermally-assisted magnetic head, the method comprising:
 providing the slider body, the slider body being disconnected with a light source unit and including a thermally-assisted magnetic head section, an air bearing surface and an optical waveguide;
 removably mounting the slider body to a test head suspension assembly loaded to a dynamic testing device, the test head suspension assembly being firmly connected with a test light source unit, and the test light source unit being configured to face to an opposite surface of the air bearing surface;
 controlling the test light source unit to provide a Gaussian beam to the slider body, the Gaussian beam aligning with the optical waveguide; and
 testing the dynamic performance of the slider body.

13. A method of testing dynamic performance for a slider body of a thermally-assisted magnetic head, the method comprising:
 providing the slider body, the slider body being disconnected with a light source unit and including a thermally-assisted magnetic head section, an air bearing surface and an optical waveguide;
 removably mounting the slider body to a test head suspension assembly loaded to a dynamic testing device;
 keeping to provide a Gaussian beam to the slider body along a direction vertical to an opposite surface of the air bearing surface, the Gaussian beam aligning with the optical waveguide;
 controlling the Gaussian beam to move synchronously with track motions of the slider body; and
 testing the dynamic performance of the slider body.

14. A method of testing dynamic performance for a slider body of a thermally-assisted magnetic head, the method comprising:
 providing the slider body and a light source unit, the light source unit being temporarily attached on an opposite surface of an air bearing surface of the slider body;
 aligning a Gaussian beam emitting from the light source unit with an optical waveguide of the slider body; and
 testing the dynamic performance of the slider body.

* * * * *